US011103946B2

(12) United States Patent
Walther

(10) Patent No.: US 11,103,946 B2
(45) Date of Patent: Aug. 31, 2021

(54) METHOD FOR BONDING LARGE MODULES, AND BONDING ARRANGEMENT

(71) Applicant: Hesse GmbH, Paderborn (DE)

(72) Inventor: Frank Walther, Paderborn (DE)

(73) Assignee: Hesse GmbH, Paderborn (DE)

( * ) Notice: Subject to any disclaimer, the term of this patent is extended or adjusted under 35 U.S.C. 154(b) by 312 days.

(21) Appl. No.: 16/428,105

(22) Filed: May 31, 2019

(65) Prior Publication Data

US 2019/0283163 A1 Sep. 19, 2019

Related U.S. Application Data

(63) Continuation of application No. PCT/DE2017/101020, filed on Nov. 24, 2017.

(30) Foreign Application Priority Data

Dec. 1, 2016 (DE) ...................... 10 2016 123 294.7
Oct. 5, 2017 (DE) ...................... 10 2017 123 122.6

(51) Int. Cl.
*B23K 1/00* (2006.01)
*B23K 20/00* (2006.01)
(Continued)

(52) U.S. Cl.
CPC .......... *B23K 1/0016* (2013.01); *B23K 20/004* (2013.01); *B23K 20/10* (2013.01); *B23K 37/00* (2013.01); *B23K 37/0235* (2013.01); *B23K 37/047* (2013.01); *B23K 37/0408* (2013.01); *B23Q 7/1463* (2013.01); *B65G 17/00* (2013.01);
(Continued)

(58) Field of Classification Search
CPC .... B23K 1/0016; B23K 37/00; B23K 20/004; B23K 20/10; B23K 37/0235; B23K 37/0408; B23K 37/04; B23K 37/047; B23K 2101/36–42; H01L 21/02;
(Continued)

(56) References Cited

U.S. PATENT DOCUMENTS 5,341,563 A 8/1994 Kamakura et al.
5,573,688 A * 11/1996 Chanasyk .............. B23K 1/008
219/388

(Continued)

FOREIGN PATENT DOCUMENTS

JP S 61-169412 A 7/1986

OTHER PUBLICATIONS

International Preliminary Report on Patentability for Application No. PCT/DE2017/101020 dated Jun. 4, 2019 with English translation.

*Primary Examiner* — Kiley S Stoner
(74) *Attorney, Agent, or Firm* — Muncy, Geissler, Olds & Lowe, P.C.

(57) ABSTRACT

A method for bonding large modules with the following steps, a large module is fed to a bonder from behind in a loading plane by means of a feeder unit. The large module is passed from the feeder unit to a first transverse conveyor unit, and is brought by the same to a first buffer position provided in the bonder, wherein the first buffer position is provided in a loading plane of the bonder. The large module is brought from the first buffer position into a first receiving position in the loading plane via the first transverse conveyor unit and is passed there to a vertical conveyor unit.

14 Claims, 10 Drawing Sheets

(51) Int. Cl.
*B23K 20/10* (2006.01)
*B23K 37/02* (2006.01)
*B23K 37/04* (2006.01)
*B23K 37/047* (2006.01)
*H01L 21/677* (2006.01)
*H01L 21/02* (2006.01)
*B23K 37/00* (2006.01)
*B23Q 7/14* (2006.01)
*B65G 19/00* (2006.01)
*B65G 17/00* (2006.01)
*B23K 101/36* (2006.01)
*B23K 101/42* (2006.01)

(52) U.S. Cl.
CPC .............. *B65G 19/00* (2013.01); *H01L 21/02* (2013.01); *H01L 21/67763* (2013.01); *B23K 2101/36* (2018.08); *B23K 2101/42* (2018.08)

(58) Field of Classification Search
CPC . H01L 21/67763; B23Q 7/1463; B65G 19/00; B65G 17/00
USPC .................. 228/6.1–6.2, 47.1, 49.1, 49.5, 43
See application file for complete search history.

(56) References Cited

U.S. PATENT DOCUMENTS

| | | | | |
|---|---|---|---|---|
| 5,922,230 A | * | 7/1999 | Yokota | .................... F27B 9/243 |
| | | | | 219/388 |
| 6,322,659 B1 | | 11/2001 | Tekavec et al. | |
| 7,568,606 B2 | * | 8/2009 | Wong | ....................... H01L 24/78 |
| | | | | 228/43 |
| 2002/0025244 A1 | | 2/2002 | Kim | |

* cited by examiner

METHOD FOR BONDING LARGE MODULES, AND BONDING ARRANGEMENT

This nonprovisional application is a continuation of International Application No. PCT/DE2017/101020, which was filed on Nov. 24, 2017, and which claims priority to German Patent Application No. 10 2016 123 294.7, which was filed in Germany on Dec. 1, 2016 and German patent application 10 2017 123 122.6, which was filed in Germany on Oct. 5, 2017, and which are all herein incorporated by reference.

BACKGROUND OF THE INVENTION

Field of the Invention

The present invention relates to a method for bonding large modules. In addition, the invention relates to a bonding arrangement for bonding large modules.

Description of the Background Art

Wire bonders are being employed increasingly and especially in heavy wire applications for processing large modules such as solar panels or battery modules. For successful processing of these large modules, the bonder itself requires a large working area, which is realized through gantry axis kinematics, for example. The working area of the gantry is limited on the one hand by the necessary dynamics and the high machine stiffness associated therewith, and on the other hand by the necessity for the working area to be accessible to an operator so that manual interventions in the entire working area remain possible. For this reason, large modules, which is to say modules that are larger than the available working area of the bonder, are normally processed in multiple steps today, wherein they are guided through the machine by an additional automation system (so-called indexer systems).

For this purpose the indexer systems, including the module receptacles, are constructed on the bonder's assembly plane, which is predetermined by the height. The processing plane (same as bonding height or bonding plane) is likewise predetermined in a region by the positioning range of the vertical axis of a bonding head of the bonder, so that widely differing product heights must be compensated for by substructures of the indexer and of the product receptacle. However, there are narrow limits on these possibilities, and the substructures cannot be flexibly adapted to different module types. At the same time, the variability of modules is also sharply increasing with respect to their height, with the result that ever greater requirements are being placed on bonders with respect to flexibility and handling of modules of different heights.

For automated production of large modules, the following functional steps are required: feeding of the module; process (bonding), including repeated indexing; removal of the module;

For uninterrupted automated production, additional buffers are required as functional steps: feeding of the module; loading buffer: holding the module ready; process (bonding), including repeated indexing; unloading buffer: holding the processed module ready; removal of the module According to the prior art, these three or five process steps are arranged together in one plane. Consequently, these solutions require a lot of space, since in addition to the actual indexer system, additional stations for loading and unloading and for buffering outside of the bonder are required that organize the feeding and removal of the modules such that the bonder is not adversely affected in its work as a result.

The feeding of the large modules and the removal of the same normally take place at opposite transverse sides of the bonder. The modules are fed to the bonder through a first transverse side, and then are positioned in the working area of the bonder. After the bonding, the modules are subsequently brought out of the working space at a second transverse side of the bonder opposite the first transverse side, and transported onward. The space required laterally next to the bonder is relatively large in this respect, since it is necessary to consider the sequential feeding of the modules to the bonding area by the indexer system on the one hand, and the loading buffer and the unloading buffer in addition. In this regard, a relatively large space must be provided between two bonders next to one another in the production process, especially in the case of large modules.

Loading and unloading times, as well as the necessary index times of such arrangements, have low performance; parameters such as the number of modules produced per unit area per hour attain only comparatively small values.

SUMMARY OF THE INVENTION

It is therefore an object of the present invention to provide an improved method for bonding large modules in this regard. A further object of the invention is to provide a bonding arrangement designed for bonding large modules.

The method according to the invention for bonding large modules provides for the following steps in this regard: a large module is fed to a bonder from behind in a loading plane by means of a feeder unit; the large module is passed from the feeder unit to a first transverse conveyor unit, and is brought by the same to a first buffer position provided in the bonder, wherein the first buffer position is provided in a loading plane of the bonder; the large module is brought from the first buffer position into a first receiving position in the loading plane by means of the first transverse conveyor unit, and is passed there to a vertical conveyor unit. By means of the vertical conveyor unit, the large module is moved vertically and brought into a bonding plane, wherein the large module in the bonding plane is located at least partially in a working area of the bonder. The large module is processed by a first bonding head, and optionally by a second bonding head in addition, wherein electrically conductive bond connections are produced on the module. The large module is moved vertically by the vertical conveyor unit out of the bonding plane into a second transfer position, and in the second transfer position is passed to a second transverse conveyor unit, wherein the second transfer position is provided in an unloading plane of the bonder. The large module is brought by the second transverse conveyor unit into a second buffer position in the unloading plane. From the second buffer position, the large module is passed to a removal unit by means of the second transverse conveyor unit.

An advantage of the invention resides in the fact that the modules are fed to the bonder in a first plane, the loading plane, and are transported away in a separate, second plane, the unloading plane. Moreover, the feeding and the discharge take place from behind or to the rear, with the result that bonders adjacent to one another need a very small spacing from one another, and in the extreme case can be arranged directly next to one another. Transverse sides that face one another of the adjacent bonders can contact one another in this respect, or the adjacent bonders can be connected to one another. The required floor space can be significantly reduced by this means. Moreover, the throughput is increased, since it is possible to work in two or three planes at the same time.

In particular, it is possible according to the invention to integrate the first buffer position (loading buffer) for the large module and the second buffer position (unloading buffer) for the large module into the bonder and to arrange them in different planes. In this respect, the modules are directly protected in the bonder and are provided in two planes in a space-saving manner.

A module can be fed to the bonder from behind or is passed to the rear to the removal unit when a recess is formed in a machine housing of the bonder in a rear side thereof for the purpose of passing the module through, or when the rear side of the bonder is recessed. The rear side of the bonder is defined here as a side opposite an operating front or front side. The front side is designed to provide an operator access to the bonder. Any monitors and control elements are located in the region of the front side, and the operator has access to the working area through the front side. The first transverse side and the second transverse side connect the front side and the rear side of the bonder.

The vertical conveyor unit can have a vertically movable support body designed to receive the module. When the module is brought out of the first buffer position into the first changeover position, the support body is arranged to be lowered below the loading plane. Advantageously, when the support body is in the lowered position, the module can be brought from the first buffer position into the first changeover position by the first transverse conveyor unit without collisions, and received there by the support body of the vertical conveyor unit as soon as the support body is moved vertically upward.

The second transfer position for the module is traveled through when said module is being brought from the first transfer position into the bonding plane. The arrangement of the second transfer position in the travel path of the vertical conveyor unit advantageously results in a very compact construction for the bonder and a small space requirement.

The support body can be moved vertically out of the bonding plane and lowered below the loading plane, wherein the module is passed to the second transverse conveyor unit during lowering of the support body while the second transfer position is traveled through. A very short cycle time and a high throughput for the bonding method according to the invention advantageously result from the transfer of the module to the second transverse conveyor unit during the lowering of the support body. In this regard, many modules can be produced per unit time.

The bonding arrangement according to the invention having a bonder, having a feeder unit for a large module that can be processed by means of the bonder, and having a removal unit for the large module. The bonder can include at least one bonding head by means of which electrically conductive bond connections can be produced on the large module during the processing of the large module. The bonder additionally includes a vertical conveyor unit that is designed to convey the large module vertically out of a loading plane into a bonding plane and/or into an unloading plane. The bonder additionally includes a first transverse conveyor unit that is associated with the loading plane and is designed to receive the large module from the feeder unit, to bring the module into a first buffer position provided in the loading plane, and to bring the large module into a first transfer position in which the large module is made available for transfer to the vertical conveyor unit.

The bonder can include a second transverse conveyor unit that is associated with the unloading plane and is designed to receive the large module from the vertical conveyor unit in a second transfer position, to bring the large module into a second buffer position, wherein the second transfer position and the second buffer position are provided in the unloading plane, and to pass the large module to the removal unit that is likewise associated with the unloading plane.

The particular advantage of the invention resides in the fact that a very compact bonding arrangement is provided in which the modules are stored or buffered in a space-saving manner in the bonder itself, and in which the feeding and removal of the modules is arranged in two separate planes. The space requirement for the bonding arrangement according to the invention is small in this regard, and a higher bonding output per unit area can be produced. Considerable cost benefits arise as a result, especially for applications in which the bonder is protected from environmental influences or is provided in a clean room environment.

For example, the bonding plane can be provided above the loading plane and above the unloading plane. For example, the unloading plane can be provided above the loading plane. The unloading plane is located between the bonding plane and the loading plane in this regard. For example, the first buffer position can be provided between the feeder unit on the one hand and the first transfer position on the other hand. In analogous fashion, the second buffer position can be provided between the removal unit on the one hand and the second transfer position on the other hand. The first buffer position and/or the second buffer position and/or the first transfer position and/or the second transfer position can be provided in a machine housing of the bonder. This advantageously results in a very compact construction, and the modules can be buffered and made available such that they are protected in the bonder and enclosed by the machine housing. By dispensing with buffering at the feeder unit or the removal unit, the feeder unit and the removal unit can have a high conveying capacity and serve to supply a multiplicity of bonders. Idle times in the area of the feeder unit or the removal unit are avoided or reduced.

The feeder unit and the removal unit can be associated with the bonder at a rear side of the same and, in particular, are arranged vertically offset one above the other, wherein the removal unit is associated with the unloading plane and the feeder unit is associated with the loading plane. Advantageously, the space requirement is further reduced by this means, and the number of modules produced per unit time and unit area is increased.

The vertical conveyor unit has a vertically extending guide rail and a support body that is held movably on the guide rail. This advantageously results in a cost-effective implementation for the vertical conveyor unit and at the same time a precise possibility for positioning the support body on the one hand, or the module provided by means of the support body on the other hand, in the first transfer position and/or in the second transfer position and/or in the bonding plane.

The first transverse conveyor unit and/or the second transverse conveyor unit each can have one carriage that is held so as to be horizontally movable, and can be brought from the first buffer position into the first transfer position or from the second buffer position into the second transfer position and back. The carriage is movable in the loading plane (first transverse conveyor unit) or in the unloading plane (second transverse conveyor unit) in this respect. The first transverse conveyor unit can be moved independently of the second transverse conveyor unit. Moreover, the first transverse conveyor unit and the second transverse conveyor unit are movable independently of the vertical conveyor unit. Regardless of the ability to move independently, the movements of the first transverse conveyor unit and of the second transverse conveyor unit, and of the vertical conveyor unit, take place in a coupled or coordinated form in the method such that a high throughput of modules is realized, idle times are avoided, and collisions of the units or modules are prevented.

If the unloading plane is located between the loading plane and the bonding plane, then the carriage of the second transverse conveyor unit associated with the unloading plane is disengaged in the associated buffer position or adjacent thereto during the travel of the vertical conveyor unit out of the loading plane into the bonding plane such that the unloading plane can be traversed without collision. Analogously, it is the case that the carriage associated with the loading plane is brought outside the positioning range of the vertical conveyor unit if the loading plane is located between the unloading plane and the bonding plane, and the module is brought with the vertical conveyor unit from the bonding plane into the unloading plane.

The bonder can provide a pressure plate for the module against which the module in the bonding plane is pressed from below by the vertical conveyor unit. In this regard, the module is in a position that is always the same and known. The pressure plate can be designed to be interchangeable in a module-specific manner.

In contrast to the conventional bonder concepts, while retaining the gantry axis system of the bonder, the invention is distinguished in this regard by the below.

Replacement of the fixed assembly plane by a lift system, which on the one hand ensures the receiving of the large modules and on the other hand clamps the large module from below against a pressure plate that is present in the processing plane. The processing plane is thus always the same regardless of the module height. The pressure plate is interchangeable in a module-specific manner.

The large modules are moved vertically upward and downward directly in the working area of the bonder by means of a vertical conveyor unit, and the loading plane, unloading plane, and bonding plane are reached in the process.

Integration of loading and unloading by means of two transverse conveyor units in two different planes within the machine.

The modules are no longer routed through the bonder, which is to say fed from a first (transverse) side and removed from a second, opposing (transverse) side. Instead, feeding and removal take place through the same side of the machine housing.

The feeding and removal of the large modules take place from behind (rear side) instead of from the transverse side. As a result, the machines can be made narrow, and can be chained optimally.

The space below the bonding plane is used optimally. In present-day bonding arrangements, the vertical positioning movement for the module is unknown, with the exception of a slight stroke motion for clamping the module, and is not used for handling of the module.

Additional advantages, features, and details of the invention are evident from the additional dependent claims and the description below. Features mentioned therein can each be essential to the invention individually or in any desired combination. Of course, features and details of the method described according to the invention also apply in connection with the bonding arrangement according to the invention and vice versa. Thus, mutual reference can always be made to the disclosure of the individual aspects of the invention. The drawings serve merely to clarify the invention by way of example, and are not restrictive in nature.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
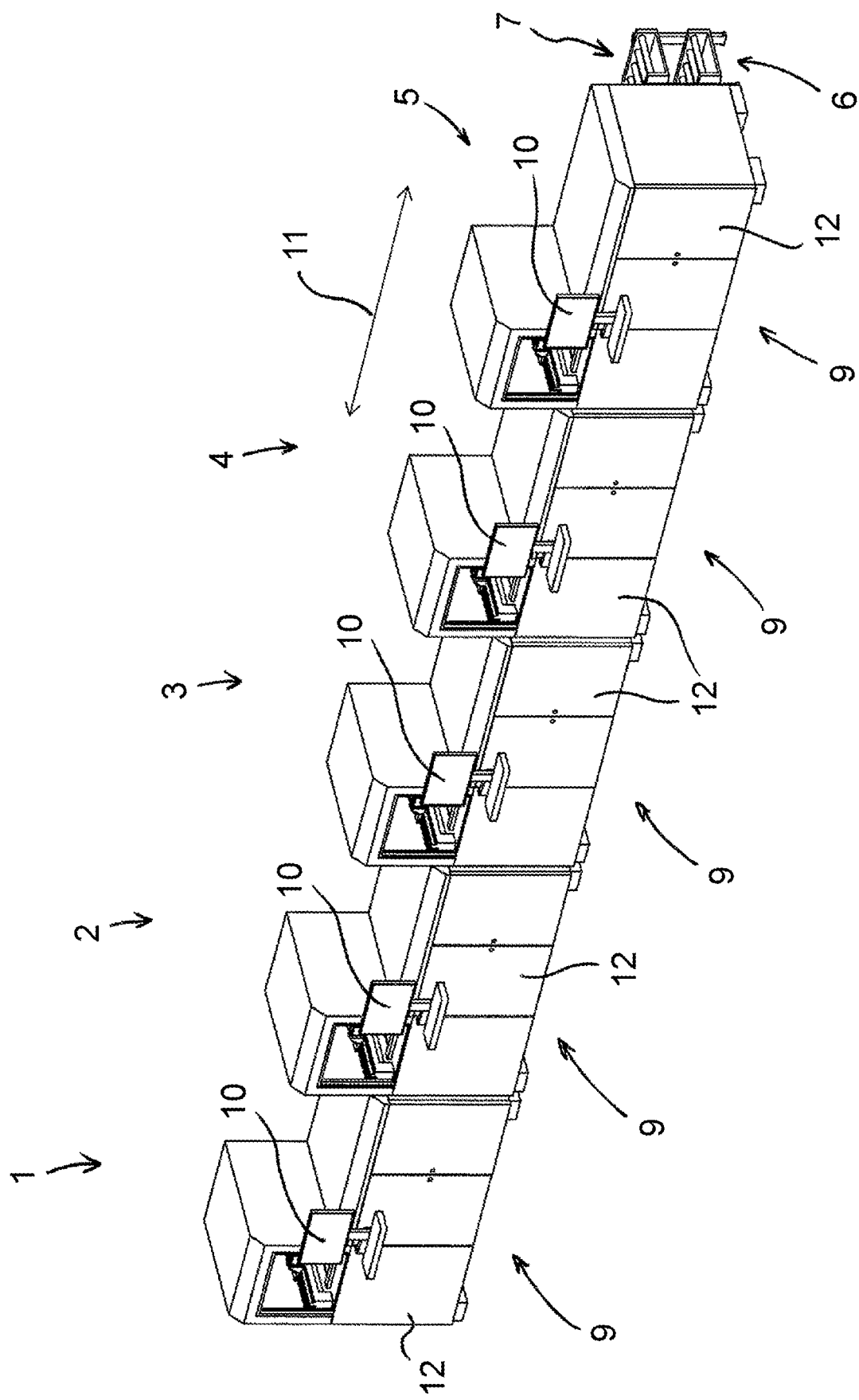
FIG. 1 shows a bonding arrangement according to the invention with a multiplicity of associated bonders next to one another in a perspective front view.
Figure 2:
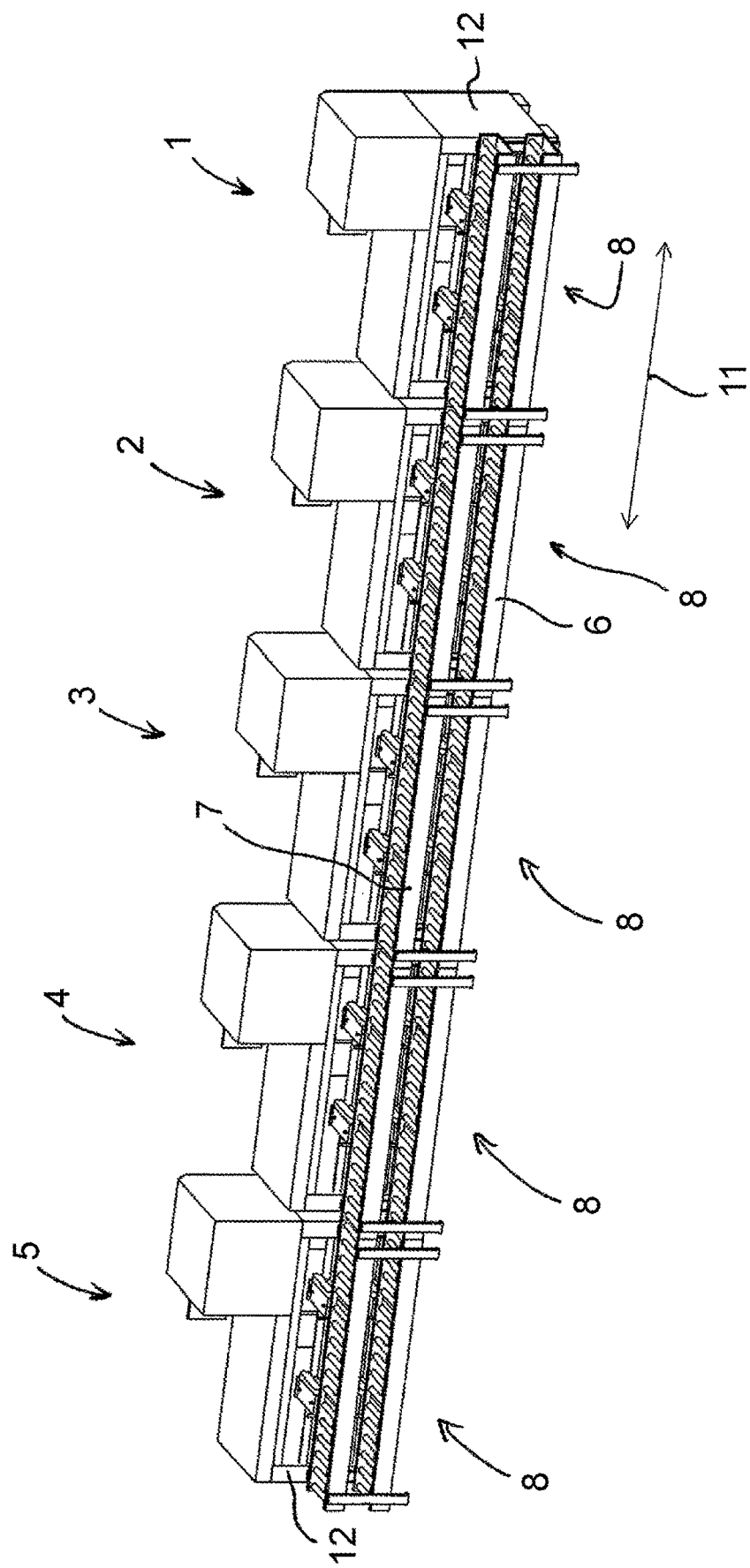
FIG. 2 shows the bonding arrangement from FIG. 1 in a perspective rear view.

A bonding arrangement according to the invention as shown in FIGS. 1 and 2 includes, by way of example, five identically designed bonders 1, 2, 3, 4, 5 and a shared feeder unit 6 and a likewise shared removal unit 7. The bonders 1, 2, 3, 4, 5 are arranged adjacent to one another, wherein transverse sides of the bonders 1, 2, 3, 4, 5 that face one another are contiguous. The feeder unit 6 and the removal unit 7 are associated with the bonders 1, 2, 3, 4, 5 on a rear side 8 of the same. Opposite the rear side 8, the bonders 1, 2, 3, 4, 5 have a front side 9, which is designed for operation of the bonders 1, 2, 3, 4, 5 by an operator. The bonders 1, 2, 3, 4, 5 are accessible in the area of the front side 9. In addition, control elements for the bonders 1, 2, 3, 4, 5 are located in the area of the front side. Likewise, a working area of the bonder 1, 2, 3, 4, 5 is accessible through the front side 9, and an operating monitor 10 is associated with the front side 9 for each bonder 1, 2, 3, 4, 5. Two transverse sides located opposite one another connect the rear side 8 and the front side 9.

Figure 6:
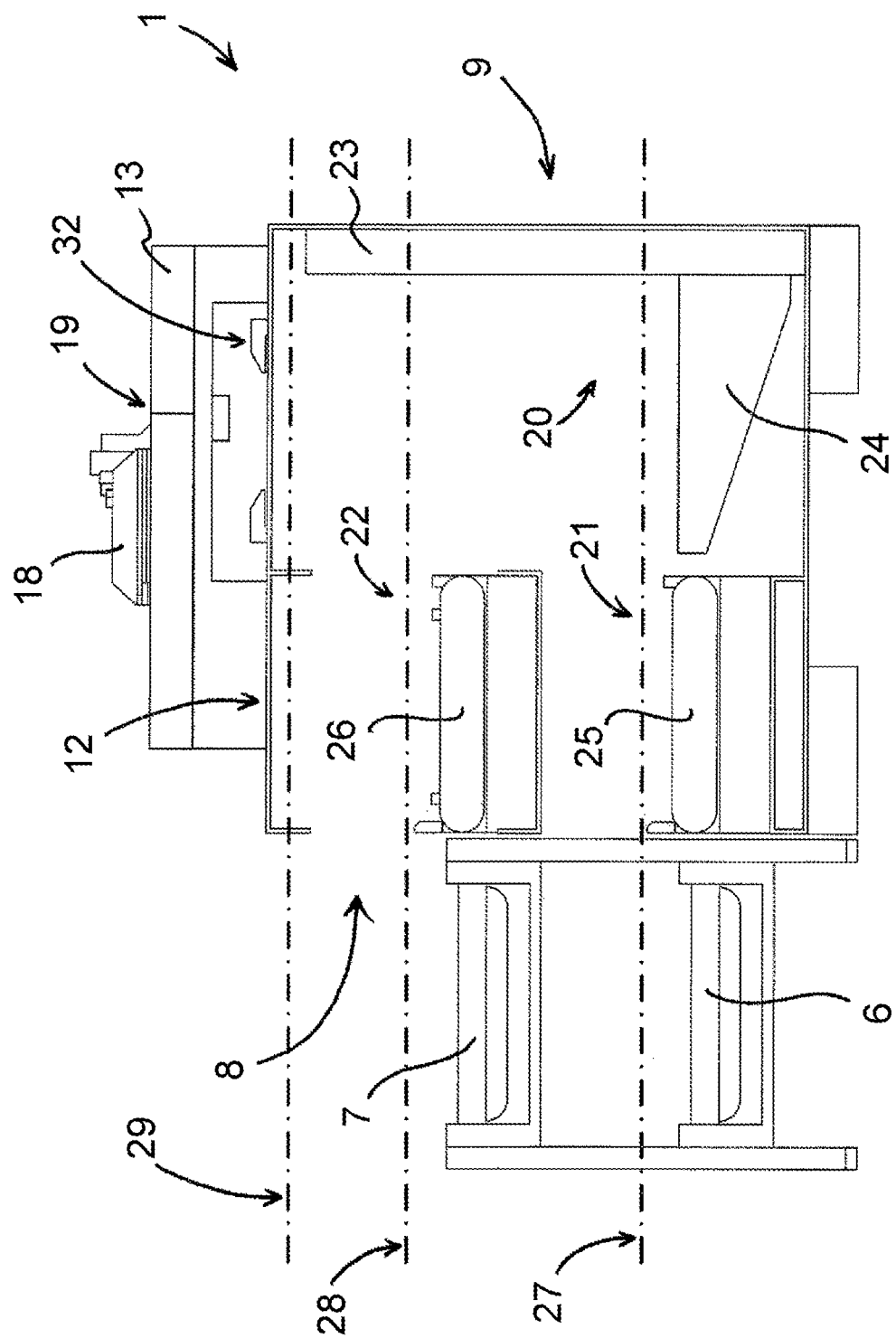
FIG. 6 is a schematic diagram of the bonding arrangement according to the invention in a side view.
Figure 7:
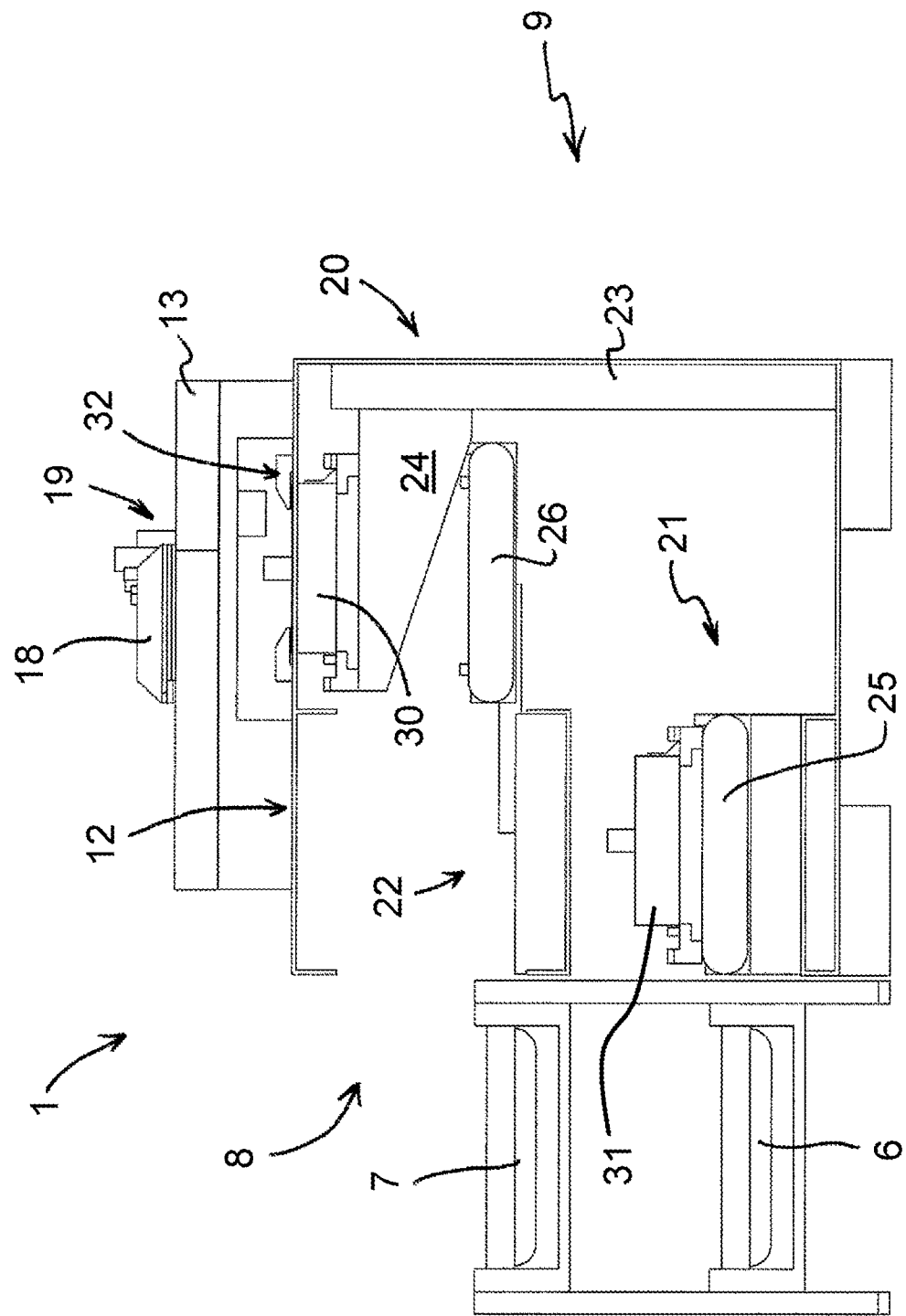
FIG. 7 shows a first method step in the provision of a module for the bonder.
Figure 8:
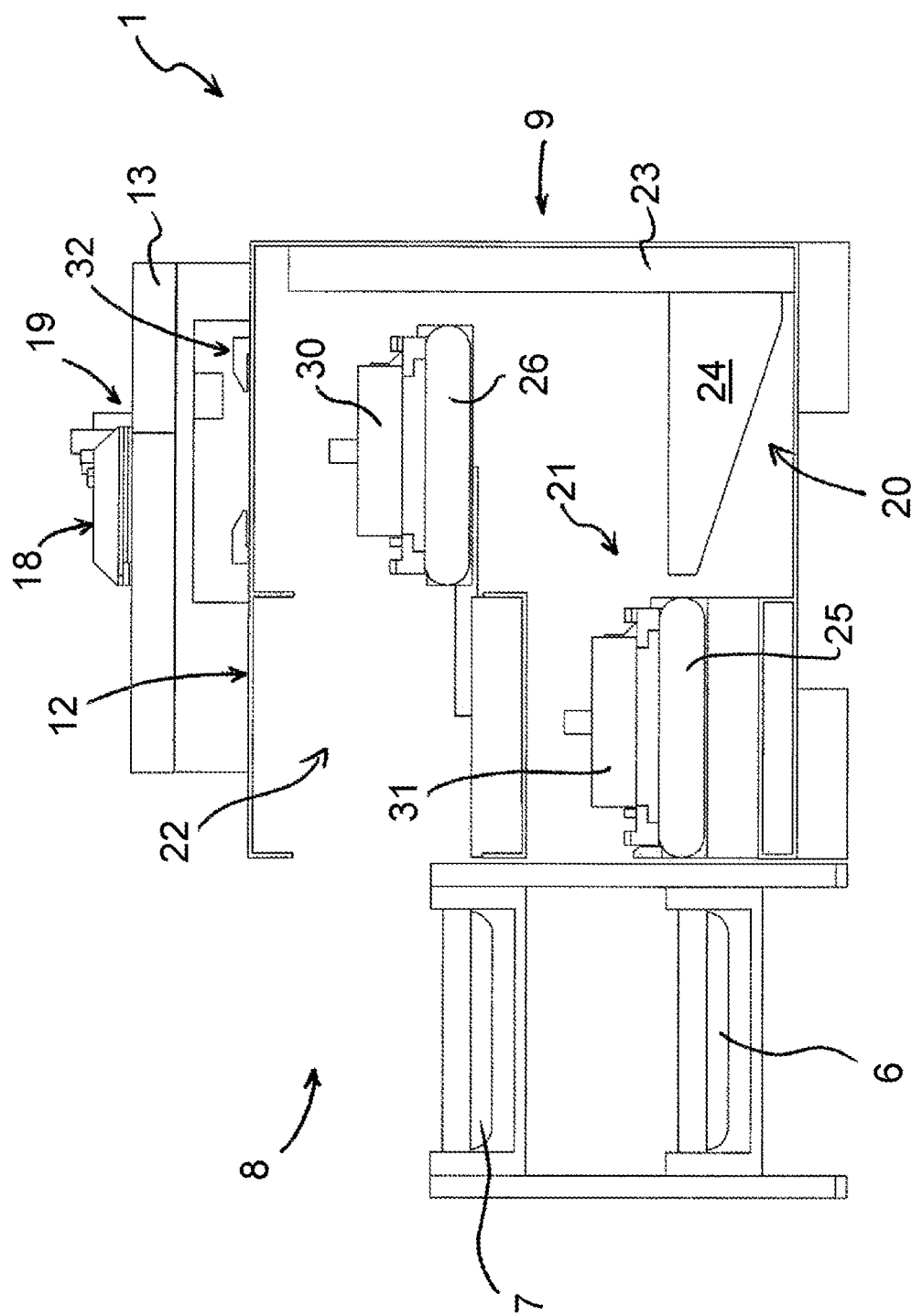
FIG. 8 shows a second method step in the provision of a module for the bonder.

The feeder unit 6 and the removal unit 7 are designed in the present case as roller conveyors, and are arranged to extend lengthwise in a transport direction 11. The removal unit 7 is provided above the feeder unit 6. The modules fed by means of the feeder unit 6 and removed by means of the removal unit 7, which are not shown in FIGS. 1, 2, and 6, are fed through a recess that is provided in a machine housing 12 of the bonders 1, 2, 3, 4, 5 in the area of the rear side 8. The transport direction runs parallel to the rear side 8.

Figure 3:
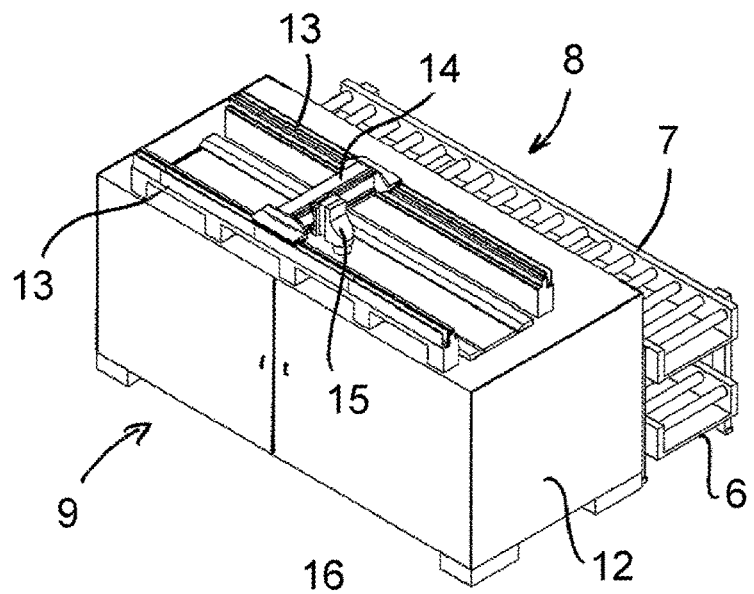
FIG. 3 shows an embodiment of a bonder of the bonding arrangement according to the invention from FIG. 1 in an individual view.
Figure 4:
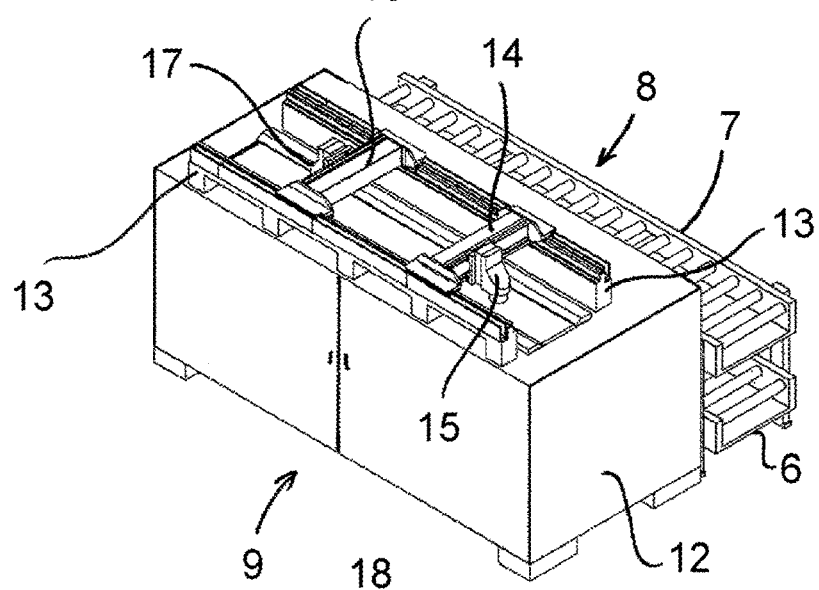
FIG. 4 shows an embodiment of a bonder of the bonding arrangement according to the invention from FIG. 1 in an individual view.
Figure 5:
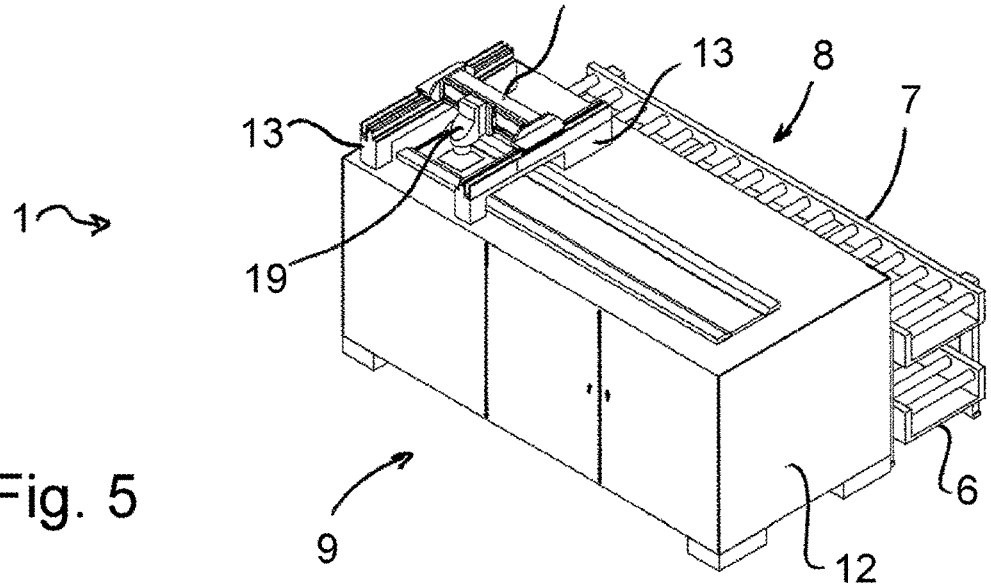
FIG. 5 shows an embodiment of a bonder of the bonding arrangement according to the invention from FIG. 1 in an individual view.

Different types of bonders 1, 2, 3, 4, 5, for example, can be provided within the bonding arrangement according to the invention. FIGS. 3 to 5 show alternative embodiments of the bonders 1, 2, 3, 4, 5 in this regard, wherein the aspects that are essential to the invention are explained for a first bonder 1 solely by way of example.

In accordance with FIG. 3, the first bonder 1 provides a parallel guide 13 extending essentially across the entire length of the bonder 1, having a transverse crossbeam 14 held so as to be longitudinally movable on the parallel guide 13 and having a bonding head 15 that is located on the transverse crossbeam 14 and is held there so as to be movable in the transverse direction. The bonding head 15 can cover a comparatively large working space in this regard through the travel of the same on the transverse crossbeam 14 and the travel of the transverse crossbeam 14 across the parallel guide 13.

FIG. 4 shows an alternative embodiment of the bonder 1, wherein the parallel guide 13 is adopted and two transverse crossbeams 14, 16 with one bonding head 15, 17 apiece are provided on the parallel guide 13. The working area of the bonder 1 according to FIG. 4 corresponds to that of the bonder 1 according to FIG. 3. However, work can be done with two bonding heads 15, 17 at once.

According to FIG. 5, the parallel guides 13 are extended laterally, and a longitudinal crossbeam 18 with a bonding head 19 is provided on the parallel guides 13. The position and arrangement of the parallel guides 13 is chosen, in particular, such that the working area of the bonder 1 according to FIG. 5 is smaller than the working area for the bonders 1 according to FIGS. 3 and 4.

FIG. 6 shows a schematic diagram of the bonding arrangement according to the invention in cross-section. In addition to the bonder 1, the feeder unit 6 and removal unit 7 are provided, which are arranged one above the other at a distance from the rear side 8 of the bonder 1. The large modules that are to be bonded are not shown for reasons of clarity.

The bonder 1 includes the machine housing 12. Provided in the machine housing 12 are a vertical conveyor unit 20, a first transverse conveyor unit 21, and a second transverse conveyor unit 22. The vertical conveyor unit 20 includes a guide rail 23 that extends vertically and a support body 24 that is movably held on the vertically oriented guide rail 23. The first transverse conveyor unit 21 provides a carriage 25 that is held so as to be horizontally movable, which in the present case is located in a first buffer position below the second transverse conveyor unit 22. From the first buffer position, the carriage 25 can be moved horizontally in the direction of the vertical conveyor unit 20 and arrive in a first transfer position in which a module is passed from the first transverse conveyor unit 21 to the vertical conveyor unit 20.

In analogous fashion, the second transverse conveyor unit 22 provides a carriage 26, which, like the carriage 25 of the first transverse conveyor unit 21, is provided so as to be horizontally movable. The carriage 26 is positioned in a second buffer position. From the second buffer position, this can be moved horizontally in the direction of the vertical conveyor unit 20 into a second transfer position.

The feeder unit 6 defines, together with the transverse conveyor unit 21, a loading plane 27 of the bonder 1, which is provided below an unloading plane 28 and a bonding plane 29. The unloading plane 28 is provided between the loading plane 27 and the bonding plane 29, and is defined by the removal unit 7 and the second transverse conveyor unit 22. Located above the unloading plane 28 is the bonding plane 29, in which a large module to be processed is provided during the processing.

The support body 24 of the vertical conveyor unit 20 can be moved along the guide rail 23 in such a manner that the large module can be positioned in the bonding plane 29. In addition, the support body 24 can be lowered to below the loading plane 27.

The method according to the invention and the details of the bonding arrangement according to the invention are described below on the basis of FIGS. 7 to 12. For this purpose, in a starting configuration according to FIG. 7, a first module 30 is held in the bonding plane 29 by the support body 24 of the vertical conveyor unit 20. The first module 30 has been fed in advance by the feeder unit 6. At the same time, a second module 31 is made available in a first buffer position by the transverse conveyor unit 21. The carriage 26 of the second transverse conveyor unit 22 is located in the second transfer position below the support body 24.

In order to now bond the second module 31, the support body 24 is lowered, along the guide rail 23, below the loading plane 27. In this process, the first module 30, which was bonded in the preceding method step, is placed on the carriage 26 of the second transverse conveyor unit 22] while the support body 24 travels through the second transfer position, see FIG. 8.

Figure 9:
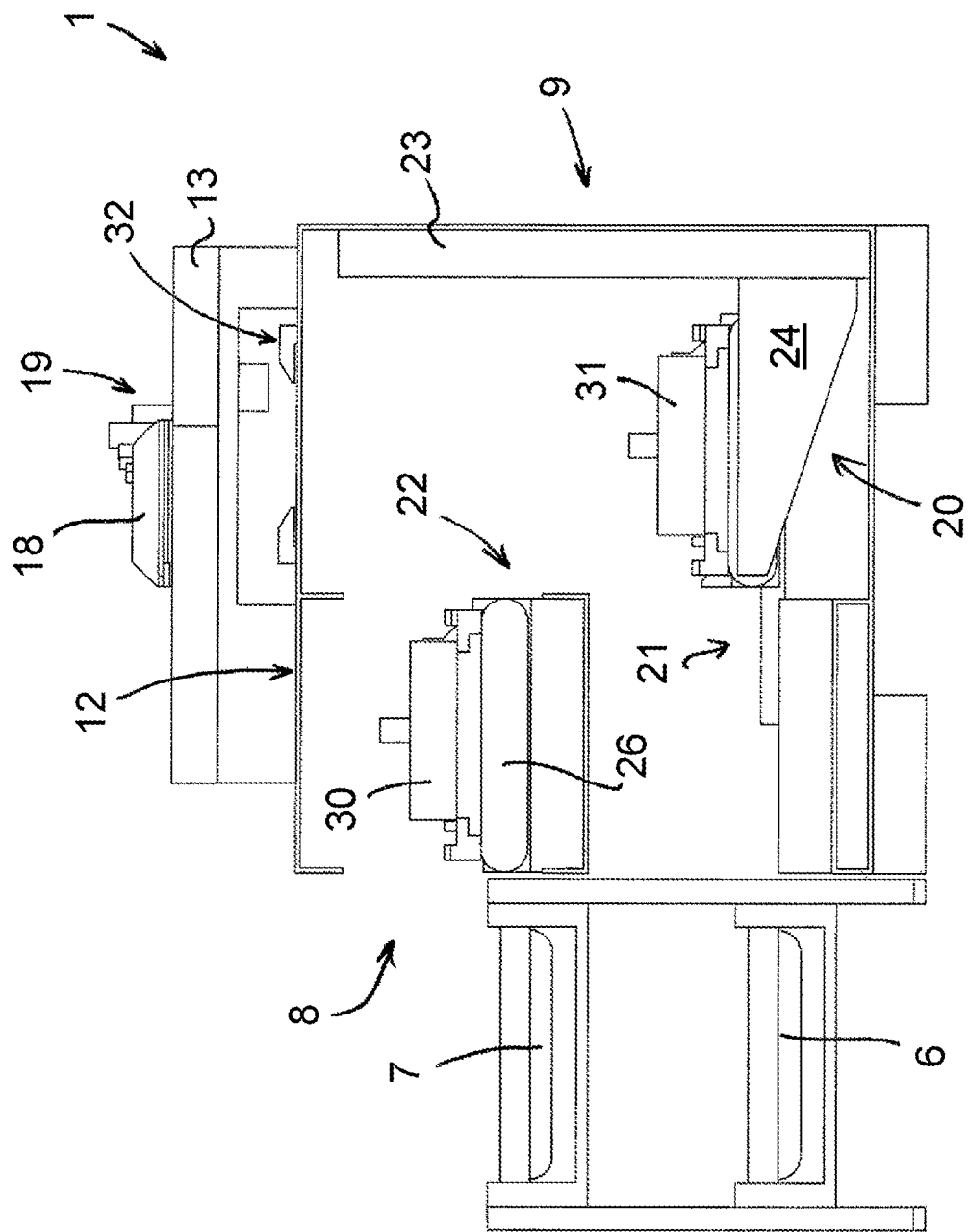
FIG. 9 shows a third method step in the provision of a module for the bonder.
Figure 10:
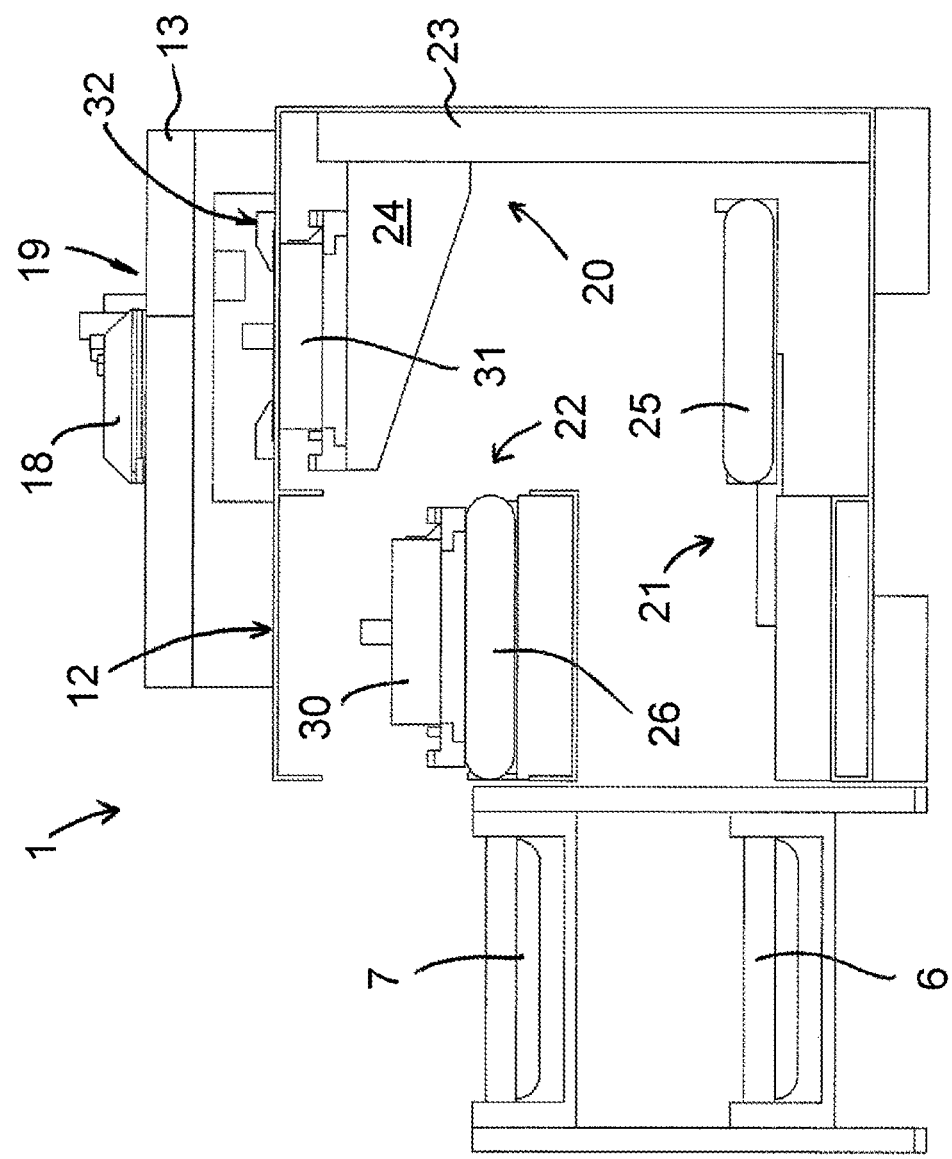
FIG. 10 shows a fourth method step in the provision of a module for the bonder.

In the next method step according to FIG. 9, the carriage 25 of the first transverse conveyor unit 21 is brought from the first buffer position into the first transfer position so that the second module 31 is provided above the support body 24 of the guide rail 23. Likewise, the carriage 26 of the second transverse conveyor unit 22 is brought into the second buffer position.

Subsequently, the second module 31 is vertically lifted by the support body 24 and brought into the bonding plane 29. There, the second module 31 is pressed against a pressure plate 32 of the bonder 1 from below, and is thus positioned in terms of height. By means of the bonding head 15, the electrically conductive bond connections are formed on the first module 30, see FIG. 10.

Figure 11:
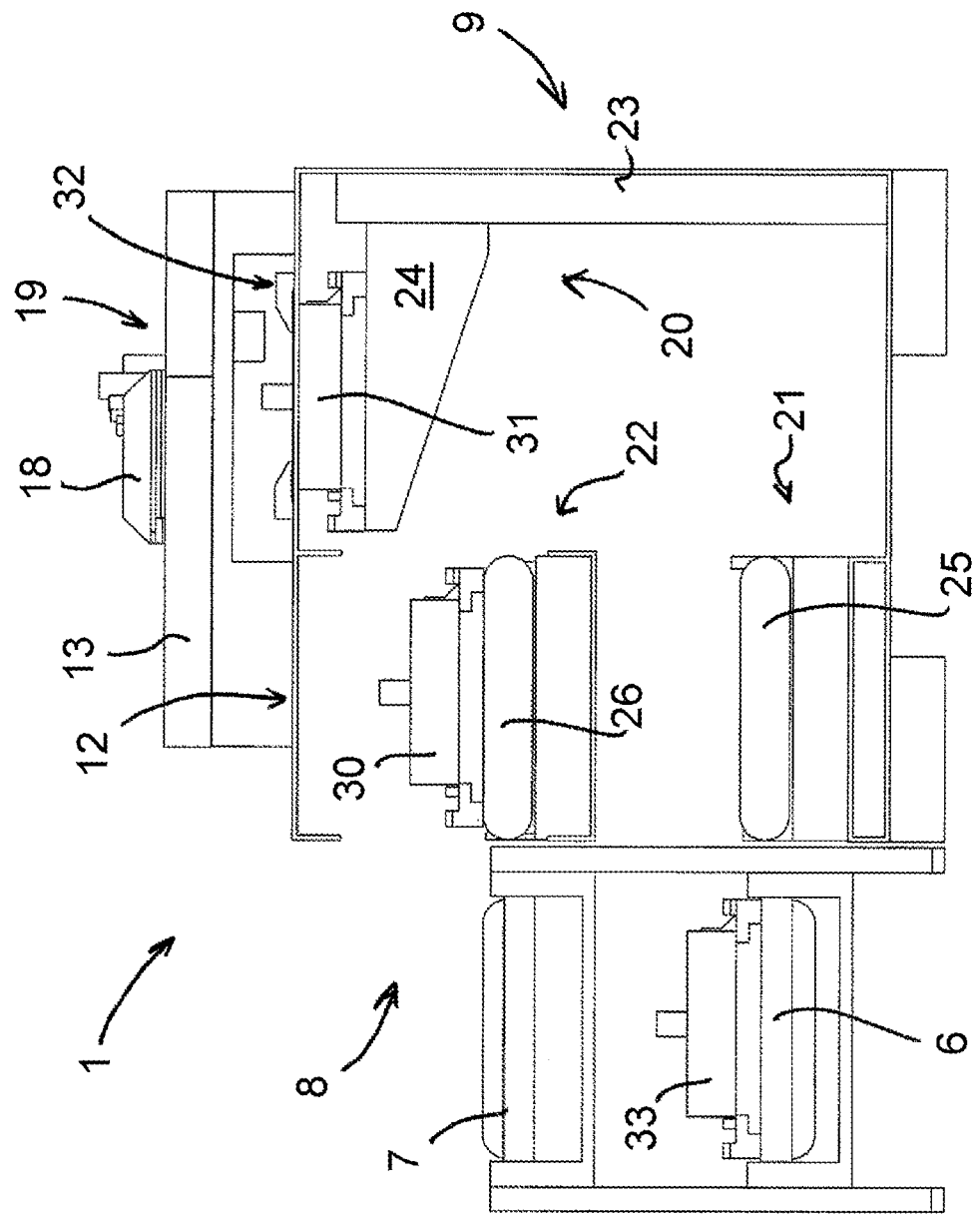
FIG. 11 shows a fifth method step in the provision of a module for the bonder.
Figure 12:
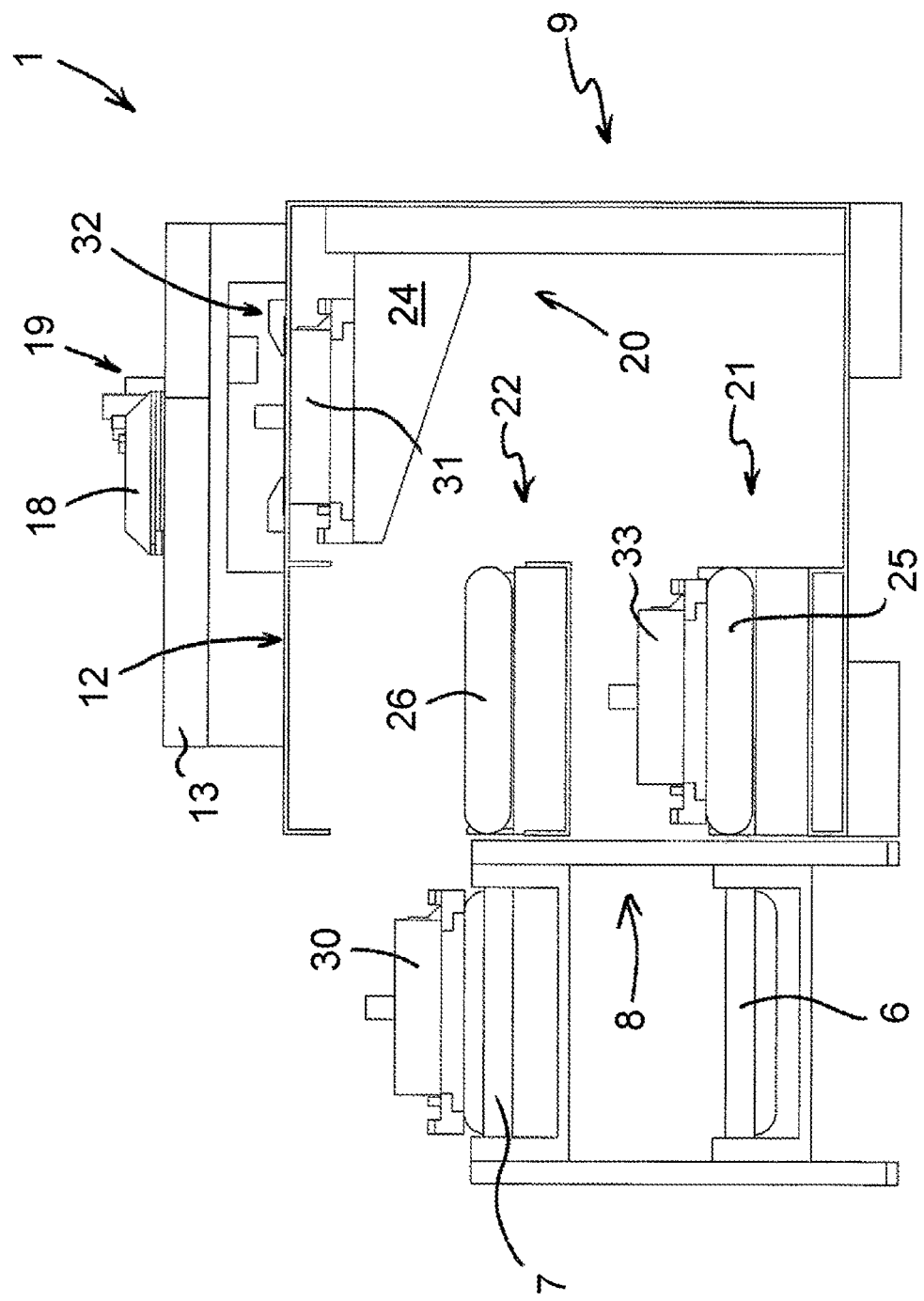
FIG. 12 shows a sixth method step in the provision of a module for the bonder.

According to FIG. 11, in the next step a third bond module 33 is made available by means of the feeder unit 6. After that, the third module 33 is brought into the first buffer position by the feeder unit 6, and the second module 31 is passed from the second buffer position to the removal unit 7, see FIG. 12. The method cycle can then be carried out again, and the first bond module 30 transported away by the removal unit 7.

The invention is not limited to the embodiment of the bonding arrangement shown, nor to the method discussed on the basis of the figures.

For example, provision can be made that the feeder unit 6 and the removal unit 7 for the modules 30, 31, 33 are implemented in an integrated manner. In this regard, a single roller conveyor or another suitable transport device can serve simultaneously as feeder unit 6 and as removal unit 7. The loading plane 27 and the unloading plane 28 then coincide.

For example, the modules 30, 31, 33 can be received from the feeder unit 6 by means of the first transverse conveyor unit 21 and moved into the machine housing 12 of the bonder 1. The carriage 25 of the first transverse conveyor unit 21, for example, can serve this purpose. For example, provision can be made that suitable means for lifting the modules 30, 31, 33 are provided on the feeder unit 6. For example, the feeder unit 6 and/or the first transverse conveyor unit 21 can have a separate handler for bringing the modules 30, 31, 33 into the first buffer position. The transfer of the modules 30, 31, 33 to the removal unit 7 can be accomplished in analogous fashion. In this regard, a suitable handler can be provided as part of the removal unit 7 and/or the modules 30, 31, 33 can be passed to the removal unit 7 by the second transverse conveyor unit 22.

Within the bonding arrangement according to the invention, it is possible to provide bonders 1, 2, 3, 4, 5 that are all of the same type, or bonders 1, 2, 3, 4, 5 of different design. The bonders 1, 2, 3, 4, 5 can optionally be provided such that they are spaced apart laterally from one another. The full contact of the transverse sides of the bonders 1, 2, 3, 4, 5 is chosen merely by way of example in this respect.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for bonding modules, the method comprising: feeding a module to a bonder from behind in a loading plane via a feeder unit; passing the module from the feeder unit to a first transverse conveyor unit, and is brought by the same to a first buffer position provided in the bonder, wherein the first buffer position is provided in a loading plane of the bonder; positioning the module from the first buffer position into a first receiving position in the loading plane via the first transverse conveyor unit and passing the module to a vertical conveyor unit; moving the vertical conveyor unit, the module is moved vertically and brought into a bonding plane, wherein the module in the bonding plane is located at least partially in a working area of the bonder; processing the module by a first bonding head and/or by a second bonding head, wherein electrically conductive bond connections are produced on the module; moving the module vertically by the vertical conveyor unit out of the bonding plane into a second transfer position, and in the second transfer position is passed to a second transverse conveyor unit, wherein the second transfer position is provided in an unloading plane of the bonder; positioning the module by the second transverse conveyor unit into a second buffer position in the unloading plane; and passing, from the second buffer position, the module to a removal unit via the second transverse conveyor unit.

2. The method according to claim 1, wherein the vertical conveyor unit has a vertically movable support body designed to receive the module, wherein the support body is lowered below the loading plane before the module is brought from the first buffer position into the transfer position.

3. The method according to claim 1, wherein, when the module is brought from the first transfer position into the bonding plane, the second transfer position for the module is traveled through and/or the second transverse conveyor unit is provided in the second buffer position.

4. The method according to claim 1, wherein the support body is moved vertically out of the bonding plane and lowered below the loading plane, and wherein, during this lowering of the support body, the module is passed to the second transverse conveyor unit while the second transfer position is traveled through.

5. A bonding arrangement comprising: a bonder; a feeder unit for a module that is adapted to be processed by the bonder; and a removal unit for the module, wherein the bonder includes at least one bonding head via which electrically conductive bond connections are be produced on the module during the processing of the module, wherein the bonder includes a vertical conveyor unit that is designed to convey the module vertically out of a loading plane into a bonding plane and/or into an unloading plane, wherein the bonder includes a first transverse conveyor unit that is associated with the loading plane and is designed to receive the module from the feeder unit, to bring the module into a first buffer position provided in the loading plane, and to bring the module into a first transfer position in which the module is made available for transfer to the vertical conveyor unit, and wherein the bonder includes a second transverse conveyor unit that is associated with the unloading plane and is designed to receive the module from the vertical conveyor unit in a second transfer position, to bring the module into a second buffer position, wherein the second transfer position and the second buffer position are provided in the unloading plane, and to pass the module to the removal unit that is associated with the unloading plane.

6. The bonding arrangement according to claim 5, wherein the bonding plane is provided above the loading plane and/or above the unloading plane.

7. The bonding arrangement according to claim 5, wherein the unloading plane is provided above the loading plane.

8. The bonding arrangement according to claim 5, wherein the first buffer position and/or the second buffer position, with respect to its horizontal location, is provided between the feeder unit and/or the removal unit and the first transfer position and/or the second transfer position.

9. The bonding arrangement according to claim 5, wherein the first buffer position and/or the second buffer position and/or the first transfer position and/or the second transfer position is provided in a machine housing of the bonder.

10. The bonding arrangement according to claim 5, wherein the feeder unit and/or the removal unit are associated with the bonder at a rear side and/or are arranged one above the other.

11. The bonding arrangement according to claim 5, wherein the bonding arrangement is designed to carry out the method comprising: feeding a module to a bonder from behind in a loading plane via a feeder unit; passing the module from the feeder unit to a first transverse conveyor unit, and is brought by the same to a first buffer position provided in the bonder, wherein the first buffer position is provided in a loading plane of the bonder; positioning the module from the first buffer position into a first receiving position in the loading plane via the first transverse conveyor unit and passing the module to a vertical conveyor unit; moving the vertical conveyor unit, the module is moved vertically and brought into a bonding plane, wherein the module in the bonding plane is located at least partially in a working area of the bonder; processing the module by a first bonding head and/or by a second bonding head, wherein electrically conductive bond connections are produced on the module; moving the module vertically by the vertical conveyor unit out of the bonding plane into a second transfer position, and in the second transfer position is passed to a second transverse conveyor unit, wherein the second transfer position is provided in an unloading plane of the bonder; positioning the module by the second transverse conveyor unit into a second buffer position in the unloading plane; and passing, from the second buffer position, the module to a removal unit via the second transverse conveyor unit.

12. The bonding arrangement according to claim 5, wherein the vertical conveyor unit has a vertically extending guide rail and a support body that is held movably on the guide rail.

13. The bonding arrangement according to claim 5, wherein the first transverse conveyor unit and/or the second transverse conveyor unit have carriages that are held so as to be horizontally movable and can be brought from the first buffer position into the first transfer position and/or from the second buffer position into the second transfer position.

14. The bonding arrangement according to claim 5, wherein at least two bonders are provided that are placed next to one another with two transverse sides of their machine housing facing one another, and wherein a shared feeder unit and/or a shared removal unit are associated with the bonders.

\* \* \* \* \*